United States Patent [19]
Eguchi

[11] Patent Number: 5,185,286
[45] Date of Patent: Feb. 9, 1993

[54] PROCESS FOR PRODUCING LAMINATED SEMICONDUCTOR SUBSTRATE

[75] Inventor: Kouhei Eguchi, Tokyo, Japan

[73] Assignee: Nippon Steel Corporation, Tokyo, Japan

[21] Appl. No.: 765,933

[22] Filed: Sep. 26, 1991

[30] Foreign Application Priority Data

Sep. 28, 1990 [JP]  Japan ................................. 2-260667

[51] Int. Cl.$^5$ ............................................ H01L 21/86
[52] U.S. Cl. ............................ 437/84; 437/89; 437/99; 437/228; 148/DIG. 150
[58] Field of Search ................ 437/89, 84, 99; 148/150

[56] References Cited

U.S. PATENT DOCUMENTS 4,498,226  2/1985  Inoue et al. .......................... 437/77
5,059,550  10/1991  Tateoka et al. ....................... 437/67

FOREIGN PATENT DOCUMENTS 0042143  3/1982  Japan ................................... 437/84
63-65648  3/1988  Japan .

Primary Examiner—Olik Chaudhuri
Assistant Examiner—Long Pham
Attorney, Agent, or Firm—Cushman, Darby & Cushman

[57] ABSTRACT

A process for producing a laminated semiconductor comprising the steps of: providing a structure comprising a first insulating film on a single crystal semiconductor substrate, the first insulating film having a plurality of openings, and a second insulating film having a predetermined width on a perpendicular bisector of a line connecting adjacent openings of the plurality of openings; growing a single crystal semiconductor layer on the first and second insulating layers by a lateral epitaxial growth through the use of the single crystal semiconductor substrate at portions exposed at the openings as a seed crystal; subjecting the single crystal semiconductor substrate to etching back or polishing parallel to the surface of the single crystal semiconductor substrate to expose the second insulating layer; and optionally selectively insulating the single crystal semiconductor layer in the opening to isolate the single crystal semiconductor layer from the single crystal semiconductor substrate. The process obtains a single crystal semiconductor layer not having a polycrystal region.

13 Claims, 3 Drawing Sheets

PROCESS FOR PRODUCING LAMINATED SEMICONDUCTOR SUBSTRATE

BACKGROUND OF THE INVENTION

1. Field of the Invention

The present invention relates to a process for producing a laminated semiconductor substrate, such as an SOI (silicon on insulator) substrate, and more particularly, to a process for producing a laminated semiconductor substrate able to be used, for example, in the production of a three-dimensional IC (integrated circuit).

2. Description of the Related Art

An SOI has a structure comprising an insulating substrate and a single crystal semiconductor layer formed thereon.

A process for the formation of the conventional SOI structure is disclosed in, for example, Japanese Unexamined Patent Publication (Kokai) No. 60-144949. In this process, an $SiO_2$ film is first formed on a single crystal silicon substrate, and predetermined portions of the $SiO_2$ film are etched to form a plurality of openings.

Thereafter, a single crystal silicon film is grown on the $SiO_2$ film by a lateral epitaxial growth according to the vapor phase growth process, through the use of the single crystal silicon substrate at portions exposed at these openings as a seed crystal.

Then, the single crystal silicon film present in the opening is locally oxidized by thermal oxidation through the use of the single crystal silicon substrate appearing at the openings as a seed crystal to form an $SiO_2$ film on this portion, thus causing the single crystal silicon film to be isolated from the single substrate by the $SiO_2$ film, whereby an SOI structure comprising a single crystal silicon film formed on an $SiO_2$ film is formed.

The above-described conventional process for forming an SOI structure, however, has the following problems.

Specifically, single crystal silicon films grown by lateral epitaxy through the use of the single crystal silicon substrate present in two openings adjacent to each other as a seed crystal collide with each other on the $SiO_2$ film, and a boundary is formed at the collided portions, and thereafter, the region near the boundary unfavorably comprises a polycrystal.

When a polycrystal region is present in the single crystal silicon film on which a device is formed, the device characteristics may become unstable due to a generation of a current leakage of other phenomenon.

Accordingly, an object of the present invention is to provide a process for producing a laminated semiconductor substrate wherein the whole semiconductor layer on the insulating substrate can form a single crystal SOI structure.

SUMMARY OF THE INVENTION

The above-described object of the present invention can be attached by a process for producing a laminated semiconductor substrate comprising the steps of: providing a structure comprising a first insulating film on a single crystal semiconductor substrate, said first insulating film having a plurality of openings, and a second insulating film having a predetermined width on a perpendicular bisector of a line connecting adjacent openings of said plurality of openings; growing a single crystal semiconductor layer on said first and second insulating layers through the use of said single crystal semiconductor substrate exposed in said openings as a seed crystal; and subjecting said single crystal semiconductor substrate to etching back or polishing parallel to the surface of said single crystal semi-conductor substrate to expose said second insulating layer.

In a preferred embodiment, the above-described process further comprises a step of locally insulating the single crystal semi-conductor layer present in the openings to isolate the single crystal semi-conductor layer from the single crystal semi-conductor substrate.

For example, a silicon dioxide layer is used as the above-described first insulating layer, and an insulating layer which can be selectively etched with respect to the above-described first insulating layer, for example, a silicon nitride layer, is suitable as the above-described second insulating layer.

In the process for producing a laminated semi-conductor substrate according to the present invention having the above-described constitution, although single crystal semi-conductor layers grown by the lateral epitaxy through the use of the single crystal silicon substrate present in two adjacent openings of the first insulating layer as a seed crystal collide with each other on the second insulating layer and a region near a boundary of collision comprises a polycrystal, the boundary and the polycrystal region near the boundary can be completely removed by the step of etching back the single crystal semi-conductor layer.

This makes it possible to form, for example, an SOI structure wherein the whole semi-conductor layer on the insulating substrate comprises a single crystal.

DESCRIPTION OF THE PREFERRED EMBODIMENTS

An embodiment of the present invention will now be described by reference to the accompanying drawings.

An embodiment of the process for forming an SOI structure according to the present invention is shown in FIGS. 1A to 1D. FIG. 2 is a plan view of the SOI structure formed according to this embodiment. FIGS. 1A to 1D correspond to cross-sectional views taken along line I—I of FIG. 2.

Figure 1A:
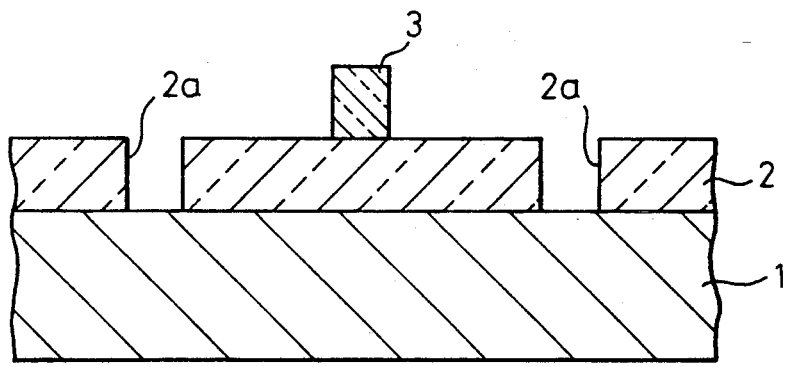
FIGS. 1A to 1D are cross-sectional views illustrating the steps of an embodiment of the process for forming an SOI structure according to the present invention.
Figure 2:
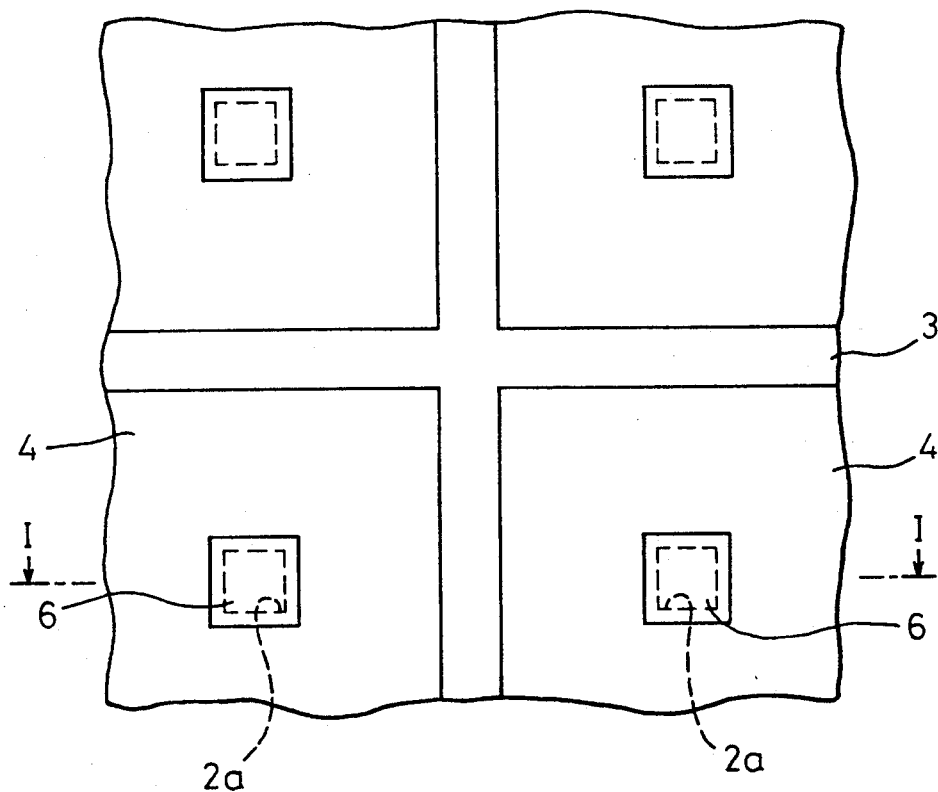
FIG. 2 is a plan view of the SOI structure formed by the process shown in FIGS. 1A to 1D.

In this embodiment, as shown in FIG. 1A, at the outset, an $SiO_2$ film 2 is formed on a single crystal silicon substrate 1 by thermal oxidation or CVD. An $Si_3N_4$ film, for example, is then formed on the $SiO_2$ film 2 by CVD. The $Si_3N_4$ film is etched to a predetermined pattern to thereby form an $Si_3N_4$ film 3 having a predetermined width. Thereafter, predetermined portions of the $SiO_2$ film 2 are etched to form a plurality of openings 2a. In this case, the $Si_3N_4$ film 3 having a predetermined width is formed on the $SiO_2$ film on a perpendicular bisector of a line connecting two adjacent openings 2a.

The thickness of the $SiO_2$ film, the dimension of the openings 2a, the space between the adjacent openings 2a, the thickness of the film 3 and the thickness of the film 3 are not limited and may be, for example, 3000 Å, 1 μm square, 5 μm, 5000 Å and 1 μm, respectively. The openings were formed to form a square.

Figure 1B:
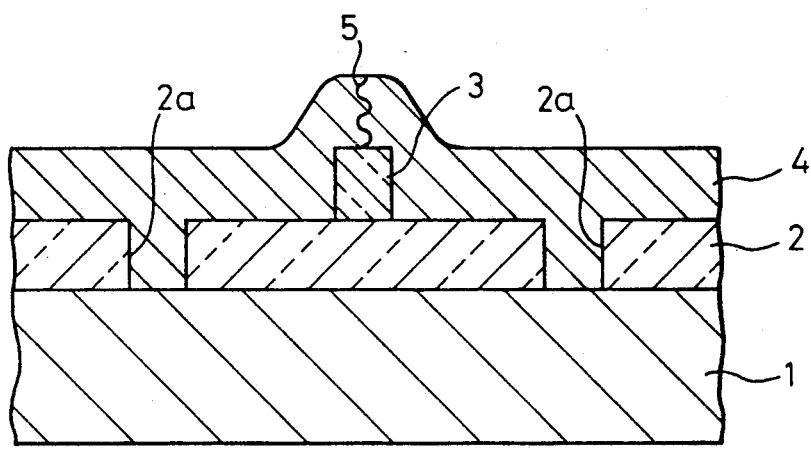

Then, as shown in FIG. 1B, a single crystal silicon film 4 is grown on the SiO$_2$ film 2 and the Si$_3$N$_4$ film 3 by a lateral epitaxy according to the vapor phase growth process through the use of the single crystal silicon substrate 1 present in the openings 2a as a seed crystal.

The lateral epitaxial growth was conducted under the following conditions, but the invention is not limited to these conditions.
gas: H$_2$ 30 liters/min, SiH$_2$Cl$_2$ 300 cc/min
pressure: 0.5 Torr
temperature: 900° C.
film thickness: 5000 Å

In this case, single crystal silicon films 4 grown by the lateral epitaxy through the use of the single crystal silicon substrate 1 present in the two adjacent openings 2a as a seed crystal collide with each other on the Si$_3$N$_4$ film 3, and a boundary 5 is formed at the collided portions. The region near the boundary 5 comprises a polycrystal.

Figure 1C:
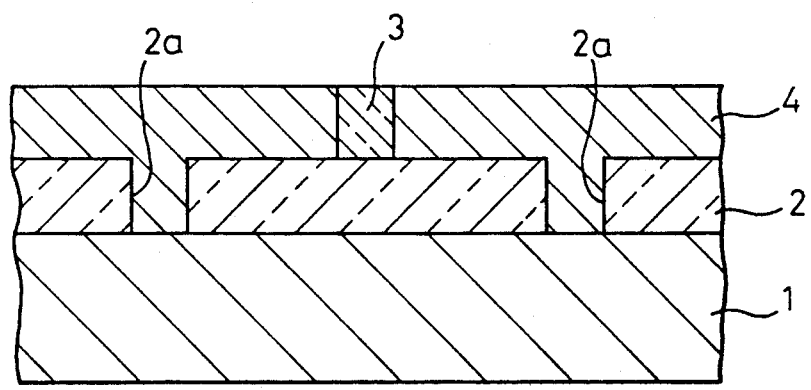

Then, for example, when an organic resin layer is spun-coated, since the top surface is levelled, an etching-back is conducted perpendicular to the surface of the substrate by plasma etching, i.e., while keeping the top surface level, until the Si$_3$N$_4$ film 3 is exposed. Thus, as shown in FIG. 1C, the single crystal silicon film 4 at a portion including the boundary 5 located on the Si$_3$N$_4$ film 3 is removed by etching to level the surface. Further, the polycrystal on the Si$_3$N$_4$ film 3 is removed, and the remaining film 4 comprises a single crystal alone.

Figure 1D:
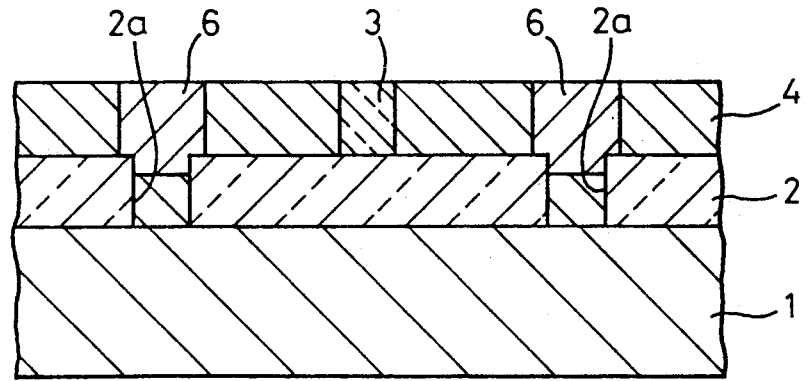

Thereafter, as shown in FIG. 1D, the single crystal silicon film 4 at a portion present in the opening 2a is locally oxidized by thermal oxidation to form an SiO$_2$ film 6 in this portion, causing the single crystal silicon film 4 to be isolated from the single crystal silicon substrate 1 by the SiO$_2$ film 6. Thus, an SOI structure comprising a single crystal silicon film 4 formed on an SiO$_2$ film 2 is formed. In this single crystal silicon film 4, as shown in FIG. 2, since the single crystal silicon films have no adjacent portions which collide with each other, the whole semi-conductor layer can form a single crystal SOI structure.

As described above, according to the present embodiment, an Si$_3$N$_4$ film 3 is formed on an SiO$_2$ film 2 on a perpendicular bisector of a line connecting adjacent openings 2a of the SiO$_2$ film 2, a single crystal silicon film 4 is grown on the SiO$_2$ film 2 and Si$_3$N$_4$ film 3 by lateral epitaxy, and the single crystal silicon film 4 is etched back until the Si$_3$N$_4$ film 3 is exposed. In this process, the boundary formed by the single crystal silicon films 4 at portions where they collide with each other, grown by lateral epitaxy through the use of the single crystal silicon substrate 1 in two adjacent openings 2a as a seed crystal, and the polycrystal region near the boundary, are completely removed during the etch back. Accordingly, neither a boundary 5 nor a polycrystal region 5 is left in the single crystal silicon film 4 in the final SOI structure. That is, according to the present embodiment, it is possible to form an SOI structure wherein the whole semi-conductor layer is a single crystal.

The second insulating film should be formed in a region where a polycrystal is formed by lateral epitaxy, and if the pattern of the opening is not regular, the above may be attained by controlling a width of the second insulating film or the like.

The process for forming an SOI structure according to this embodiment is suitable for use in the production of three-dimensional devices, for example, three-dimensional IC. Further, for example, in the SOI structure according to this embodiment, if n-channel MOSFET and p-channel MOSFET are formed respectively in two single crystal silicon films 4 completely insulated and isolated by the SiO$_2$ films 2,6 and the SiN film 3 and a CMOS is formed by the n-channel MOSFET and p-channel MOSFET, a latch-up can be prevented and, at the same time, an improvement of an operation speed or the like can be obtained by virtue of a reduction in the parasitic capacity.

Figure 3:
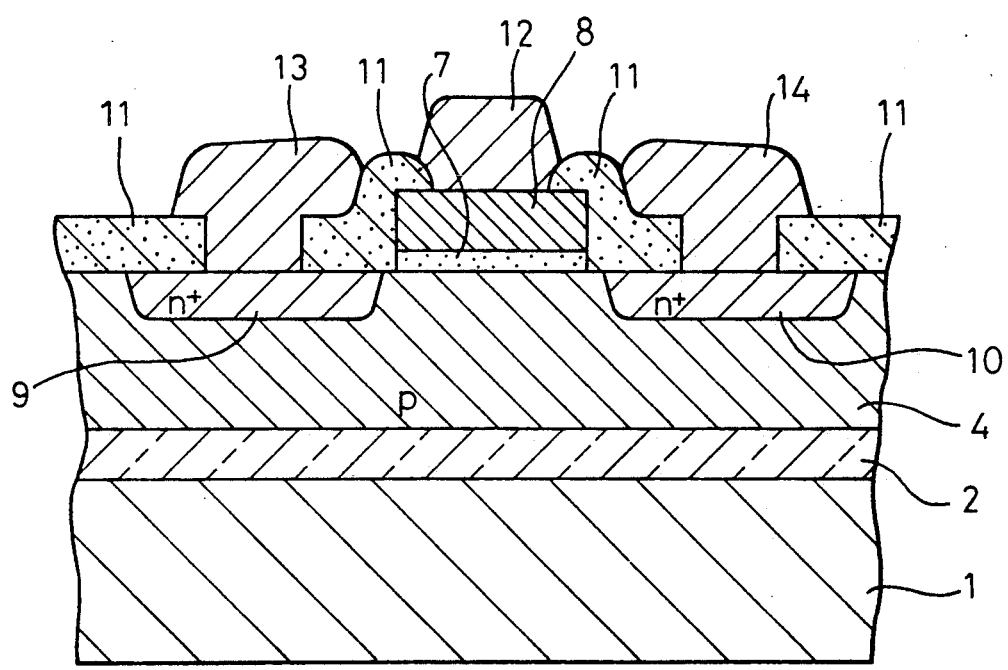
FIG. 3 is a cross-sectional view of MOSFET wherein use is made of the SOI structure formed by the process shown in FIG. 1.

An embodiment wherein a MOSFET is formed in the above-described SOI structure is shown in FIG. 3. In FIG. 3, a silicon substrate 1, an SiO$_2$ film 2 and a single crystal silicon film 4 respectively correspond to those shown in FIG. 1. The MOSFET shown in FIG. 3 is produced, for example, by the following process to obtain a structure shown in FIG. 3. First, a gate oxide film 7 is formed on a single crystal silicon film 4, and a semi-conductor film for a gate is then formed thereon. Thereafter, a local etching is conducted to form a gate oxide film 7 and a gate 8 shown in FIG. 3. A source 9 and a drain 10 are formed respectively in predetermined regions within the single crystal silicon substrate 4 through ion implantation. After the formation of the source 9 and drain 10, an SiO$_2$ film 11 is formed on this semi-conductor wafer, and predetermined portions of the SiO$_2$ film 11 are etched to form respective contact holes of the gate, source and drain. Thereafter, a gate electrode 12, a source electrode 13 and a drain electrode 14 are formed through the use of a metal, such as aluminum, on respective contact holes.

The present invention was described with reference to an embodiment, but is not limited to the above-described embodiment only, and can be modified in various useful forms based on the technical concept of the present invention.

For example, in the above-described embodiment, although a description has been made of the application of the process of the present invention to the producing of an SOI structure comprising a silicon film 4 formed on an SiO$_2$ film 2, it is also possible to apply the present invention to a process for producing various other laminated semi-conductor substrates.

In the present invention, due to the above-described constitution, since the boundary formed on the single crystal semi-conductor layer at portions where they collide with each other, grown by lateral epitaxy through the use of the single crystal silicon substrate present in the two adjacent openings as a seed crystal, and the polycrystal region near the boundary can be removed, it is possible to form, for example, an SOI structure wherein the whole semi-conductor layer on an insulating substrate comprises a single crystal.

I claim:

1. A process for producing a laminated semiconductor comprising the steps of:
 roviding a structure comprising a first insulating film on a single crystal semiconductor substrate, said first insulating film having a plurality of openings, for exposing a part of said single crystal semiconductor substrate, and a second insulating film having a width on a perpendicular bisector of a line connecting adjacent openings of said plurality of openings;

growing a single crystal semiconductor layer on said first and second insulating layers through the use of said single crystal semiconductor substrate exposed on said openings as a seed crystal; and subjecting said single crystal semiconductor layer to etching back or polishing parallel to the surface of said single crystal semiconductor substrate to expose said second simulating layer.

2. A process according to claim 1, which further comprises a step of locally insulating the single crystal semiconductor layer in the openings to isolate the single crystal semiconductor layer form the single crystal semiconductor substrate.

3. A process according to claim 1, wherein said single crystal semiconductor substrate and said single crystal semiconductor layer include silicon.

4. A process according to claim 3, wherein said fist insulating film includes silicon oxide.

5. A process according to claim 3, wherein said second insulating film includes silicon nitride.

6. A process according to claim 1, wherein said step of etch-backing is conducted by forming an organic resin layer n said single crystal semiconductor layer so as to have a flat top surface and subjecting said organic resin layer and said single crystal semiconductor layer to plasma etching.

7. A process for producing a laminated semiconductor comprising the steps of:

providing a structure comprising a fist insulating film on a single crystal semiconductor substrate, said first insulating film having a plurality of openings for exposing a part of said single crystal semiconductor substrate, and a second insulating film having a width on a perpendicular bisector of a line connecting adjacent openings of said plurality of openings;

growing a single crystal semiconductor layer on said fist and second insulating layers by a lateral epitaxial growth through the use of said single crystal semiconductor substrate which is exposed on said openings as a seed crystal; and subjecting said single crystal semiconductor layer to etching back or polishing parallel to the surface of said single crystal semiconductor substrate to expose said second insulating layer.

8. A process according to claim 7, wherein said lateral epitaxial growth includes the step of subjecting said single crystal semiconductor layer to a vapor phase growth method.

9. A process according to claim 7, wherein said single crystal semiconductor substrate and said single crystal semiconductor layer include silicon.

10. A process according to claim 9, wherein said first insulating film includes silicon oxide.

11. A process according to claim 9, wherein said first insulating film includes silicon nitride.

12. A process according to claim 7, further comprising the step of locally insulating said single crystal semiconductor layer in the openings to isolate the single crystal second torr layer form said single crystal semiconductor substrate.

13. A process according to claim 7, wherein said step of etching back includes the step of forming an organic resin layer on said single crystal semiconductor layer so as to have a flat top surface and then subjecting said organic resin layer and said single crystal semiconductor layer to plasma etching.

* * * * *